(12) United States Patent
Singh et al.

(10) Patent No.: US 7,460,922 B1
(45) Date of Patent: Dec. 2, 2008

(54) SCANNER OPTIMIZATION FOR REDUCED ACROSS-CHIP PERFORMANCE VARIATION THROUGH NON-CONTACT ELECTRICAL METROLOGY

(75) Inventors: Bhanwar Singh, Morgan Hill, CA (US); Jason Phillip Cain, Sunnyvale, CA (US); Harish Kumar Bolla, Sunnyvale, CA (US); Iraj Emami, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 439 days.

(21) Appl. No.: 11/298,340

(22) Filed: Dec. 7, 2005

(51) Int. Cl.
*G06F 19/00* (2006.01)
(52) U.S. Cl. .............................. 700/121; 700/98; 438/40
(58) Field of Classification Search .................. 700/121, 700/189, 98; 355/67, 77, 53; 430/322, 394, 430/330, 30; 438/40
See application file for complete search history.

(56) References Cited

U.S. PATENT DOCUMENTS

| | | | | |
|---|---|---|---|---|
| 3,955,081 | A * | 5/1976 | Sato et al. | 250/210 |
| 5,243,377 | A * | 9/1993 | Umatate et al. | 355/53 |
| 5,581,324 | A * | 12/1996 | Miyai et al. | 355/53 |
| 6,292,255 | B1 * | 9/2001 | McCullough | 355/67 |
| 6,674,509 | B2 * | 1/2004 | Suzuki | 355/53 |
| 6,713,815 | B2 * | 3/2004 | Utsunomiya et al. | 257/347 |
| 6,866,974 | B2 * | 3/2005 | Kim et al. | 430/30 |
| 7,180,576 | B2 * | 2/2007 | Hansen | 355/67 |
| 7,289,198 | B2 * | 10/2007 | Starikov et al. | 356/123 |
| 2005/0018164 | A1 * | 1/2005 | Hansen | 355/69 |
| 2006/0206851 | A1 * | 9/2006 | Van Wingerden et al. | 716/19 |

OTHER PUBLICATIONS

Maynard et al., Modeling and optimization of wafer Radial Yiels, 1999, IEEE, pp. 71-75.*

* cited by examiner

*Primary Examiner*—Kidest Bahta
(74) *Attorney, Agent, or Firm*—Amin, Turocy & Calvin, LLP (57) ABSTRACT

The disclosed embodiments reduce across-chip performance variation through non-contact electrical metrology. According to a feature is a process control system that includes a component that measures transistor electrical performance in a product wafer. Also included in the system is a mapping component that converts the transistor performance into exposure dose values and a process tool that communicates the exposure dose value to a scanner. The exposure dose value is fed back for optimization of future chip exposures. The disclosed embodiments directly optimize transistor performance, thus controlling an important parameter in many integrated circuits.

20 Claims, 12 Drawing Sheets

SCANNER OPTIMIZATION FOR REDUCED ACROSS-CHIP PERFORMANCE VARIATION THROUGH NON-CONTACT ELECTRICAL METROLOGY

TECHNICAL FIELD

The subject disclosure relates generally to semiconductor fabrication, and more specifically to increasing performance consistency through optimization of the lithographic exposure process.

BACKGROUND

As use of and demand for semiconductor devices increases, improvements in size, performance and yield are constantly being developed and improved. Achieving the objectives of miniaturization and higher packing densities continue to drive the semiconductor manufacturing industry toward improving semiconductor processing in every aspect of the fabrication process. For example, at least one and typically more than one photolithography process may be employed during the fabrication of a semiconductor device. Each factor and variable implemented during fabrication should be considered and improved in order to achieve higher packing densities and smaller, more precisely formed semiconductor structures. To increase yield, which is the percentage of finished products leaving the fabrication process compared to the number of products that entered the fabrication process, control and/or quality of individual fabrication processes should be improved through continuous monitoring and/or adjustment.

Semiconductor fabrication is a manufacturing process that includes a large number of steps and/or processes that control and build the devices. The basic processes utilized are layering, doping, heat treating, and patterning. The layering process adds thin layers to a wafer surface. Layers can be insulators, semiconductors and/or conductors, for example, and are grown or deposited through a variety of process including chemical vapor deposition (CVD), evaporation, and sputtering. The doping process adds specific amounts of dopants to the wafer surface, which can cause modification of the layer properties (e.g., change a semiconductor to a conductor). Doping techniques include thermal diffusion and ion implantation. During the heat treating process, a wafer is heated and cooled to achieve specific results. Typically, during heat treatment no additional material is added or removed from the wafer, although contaminates and vapors may evaporate from the wafer. Annealing is a common heat treatment that repairs damage to the crystal structure of a wafer/device, which is generally caused by doping operations. Other heat treating techniques include alloying and driving of solvents.

The pattering process is considered the most important of the four basic processes and is a series of steps designed to remove selected portions of surface layers. After removal, a pattern of the layer is left on the wafer surface. The removed material can be in the form of a hole in the layer or a remaining island of the material, for example. The pattering transfer process is sometimes referred to as photomasking, masking, photolithography, or microlithography. The goal of the pattering process is to create specific shapes with specific dimension (e.g., feature size) as determined by a circuit design and to locate the shapes in the proper location on the wafer surface.

A process control system is generally employed to perform one or more of the pattering or lithography processes. The process control system can control various parameters including development time, resist flow, and the like. The process control system can monitor characteristics including etch rate, dimensions, feature size, etc. to determine whether fabricated devices are acceptable according to design tolerance specifications and control limit(s). Variation of circuit feature critical dimensions, such as transistor gate linewidth can lead to unwanted variation in circuit performance. Reduction of unwanted across-chip transistor performance variation can improve the performance of chips made in subsequent production lots.

SUMMARY

The following presents a simplified summary of the various embodiments in order to provide a basic understanding of some aspects presented herein. This summary is not an extensive overview of the various embodiments. It is intended to neither identify key or critical elements nor delineate the scope of the embodiments. Its sole purpose is to present some concepts in a simplified form as a prelude to the more detailed description that is presented later.

According to a feature disclosed and claimed herein, in one aspect thereof, comprises a process control system. The system includes a component that measures transistor electrical performance in a production wafer. Also included is a mapping component that converts the transistor performance into exposure dose values and a process tool that communicates the exposure dose value to a scanner.

According to an embodiment is a method for reducing across-chip performance variation. The method can include measuring transistor electrical performance in production chips and converting the transistor electrical performance into a corresponding exposure dose value. The corresponding exposure dose value can be applied to subsequent product chips.

The following description and the annexed drawings set forth in detail certain illustrative aspects of the disclosed embodiments. These aspects are indicative, however, of but a few of the various ways in which the principles of the embodiments may be employed and the subject disclosure is intended to include all such aspects and their equivalents. Other advantages and novel features will become apparent from the following detailed description when considered in conjunction with the drawings.

DETAILED DESCRIPTION

The various embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the embodiments may be practiced without these specific details. In other instances, well-known structures and devices are shown in block diagram form in order to facilitate describing the embodiments.

As used in this application, the terms "component," "module," "system" and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

The word "exemplary" is used herein to mean serving as an example, instance, or illustration. Any aspect or design described herein as "exemplary" is not necessarily to be construed as preferred or advantageous over other aspects or designs.

As used herein, the terms to "infer" or "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 1:
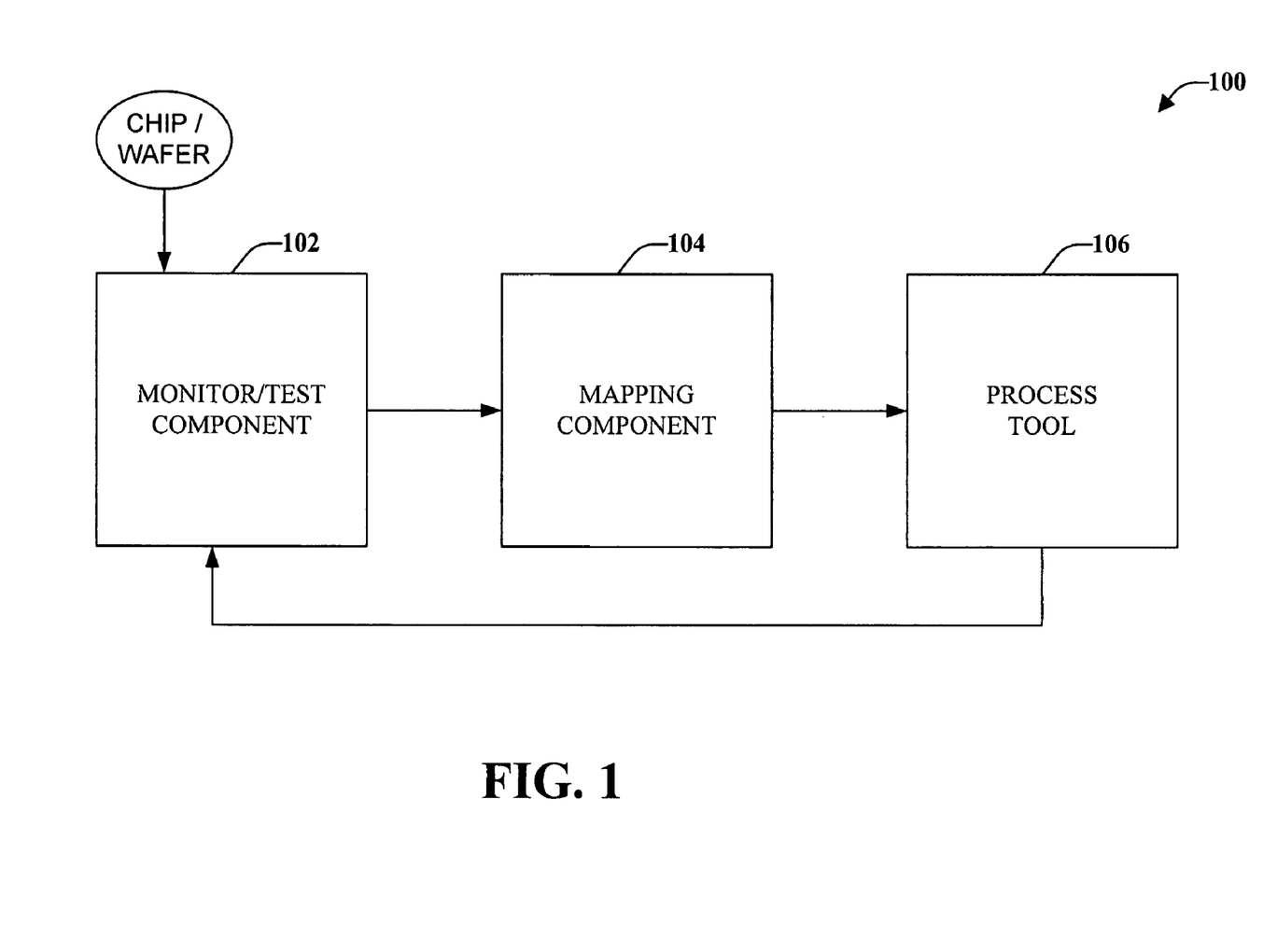
FIG. 1 is a block diagram illustrating a control system that reduces across-chip performance variation during semiconductor fabrication.

Referring now to the drawings, FIG. 1 is a block diagram illustrating a control system 100 that reduces across-chip performance variation during semiconductor fabrication. System 100 includes a monitor/test component 102 that interfaces with a mapping component 104 and a process tool 106. There can be additional or fewer system components and/or the components can be combined. All such modifications are considered a part of the subject disclosure and appended claims.

System 100 is configured to monitor variations in performance both across the chip (the piece of semiconductor wafer containing the entire circuit) and/or across the wafer (a thin, generally less than about 1 mm, disk of crystalline semiconductor that is cut into chips after processing). System 100 is further configured to autonomously alter one or more parameters of the fabrication process to mitigate across-chip and/or across-wafer performance variation. System 100 can interface with a control component (not shown) to implement the disclosed techniques.

Monitor/test component 102 is configured to perform non-contact electrical measurements of transistor and/or logic block performance. For example, monitor/test component 102 can perform a metrology test. Typical metrology testing measurements include critical dimensions measurements, which include the widths of the lines and spaces of critical circuit patterns including the area of contacts. Other measurements taken during metrology include film thickness and/or overlay, which is superposition of a pattern on a mask to a pattern previously created on the surface of the wafer. The measurements can be made upon several device test structures that are placed at various locations within a chip. In addition or alternatively, monitor/test component 102 can analyze quality parameters of the fabrication process to determine if device quality is within an acceptable range and/or analyze product yield goals for the current semiconductor device and stage of fabrication.

The measurements taken by monitor/test component 202 can be communicated to mapping component 104 that creates a map or comparison of, for example, the across-chip transistor performance. The mapping component 104 can be configured to characterize the spatial variation or differences in transistor performance based in part on the electrical measurements of transistor and/or logic block performance. Various algorithms, methods, and/or techniques can be applied to the data to determine a scanner exposure dose that will achieve the desired transistor performance at each location within the chip.

The determined scanner expose dose is communicated to the process tool 106 that is configured to implement recommended changes to improve performance of future or subsequent chips in the fabrication process. Recommended changes can include, for example, modulating the exposure dose by varying a scanning speed, altering the exposure on a chip-by-chip basis, etc. Thus, transistor performance can be optimized directly, which controls an important parameter in many integrated circuits.

Figure 2:
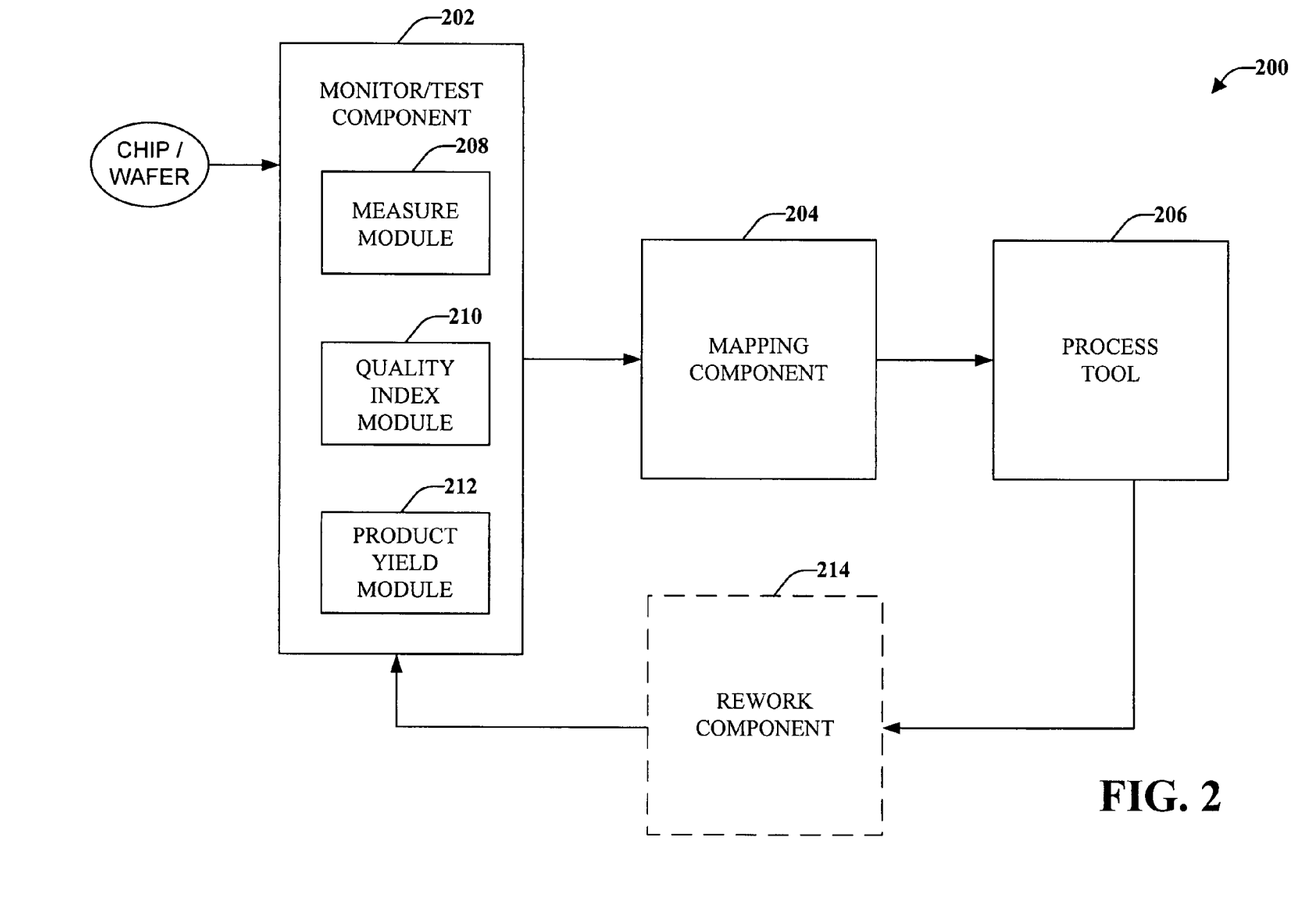
FIG. 2 is a block diagram illustrating a system that monitors chips as a part of the standard production process flow.

FIG. 2 is a block diagram illustrating a system 200 that monitors chips as a part of the standard production process flow. System 200 includes a monitor/test component 202 that is configured to monitor various parameters of a production process. Monitor/test component 202 interfaces with a mapping component 204 that analyzes the parameter information and recommends a production process modification to a process tool 206. One or more modifications to the production process can be applied to subsequent chips in the process and subsequent monitoring by the monitor component 202 can be performed, through a feedback loop.

Monitor/test component 202 can include a measure module 208, a quality index module 210, and/or a product yield module 212. It should be understood that the system 200 may include additional components and/or modules or may not include all of the components and/or modules discussed in connection with FIG. 2.

Measure module 208 is configured to utilize transistor performance measurements obtained through use of non-contact electrical metrology. These measurements can be made upon several device test structures that are placed at multiple locations within a chip allowing for characterization of the spatial variation in transistor performance. The use of non-contact electrical metrology allows measurements to be taken "in-line" or as part of the standard production process flow. The measurements can provide information about the variation in performance both across the chip and across the wafer. Multiple test structures can be used in order to determine performance variation for different feature sizes, orientations, logic structures, etc.

According to other embodiments, monitor/test component 202 can include a quality index module 210. The quality index 210 can represent expected parameter values from product design simulation, test results, electrical data, and the like. A simulation of the desired etch process, for example, can be compared to the current device to determine if the current parameter values yield acceptable results. If the quality index 210 is within an acceptable range, the process can continue. If the quality index 210 falls below an acceptable range, the device can be processed through a rework component 214. It is to be understood that the rework component 214 is optional and in some embodiments not be utilized with system 200. Rework component 214 can, for example, undo a masking operation by removing the remaining photoresist and/or can perform a cleaning process. In such a manner, the device can be in substantially the same processing state it was in prior to the original patterning operation performed by a mask pattern process. Patterning is a non-destructive process and can be repeated a number of times until an acceptable quality index 210 is obtained.

A product yield component 212 can include information relating to product yield goals for the current device and stage of fabrication. If the product yield goal is met or exceeded, the process can continue in substantially the same manner. However, if the product yield goal is below an acceptable level, various parameters of the fabrication process can be altered to bring the actual product yield up to the product yield goal. These parameters can be modified by process tool 206 or a control component (not shown).

Figure 3:
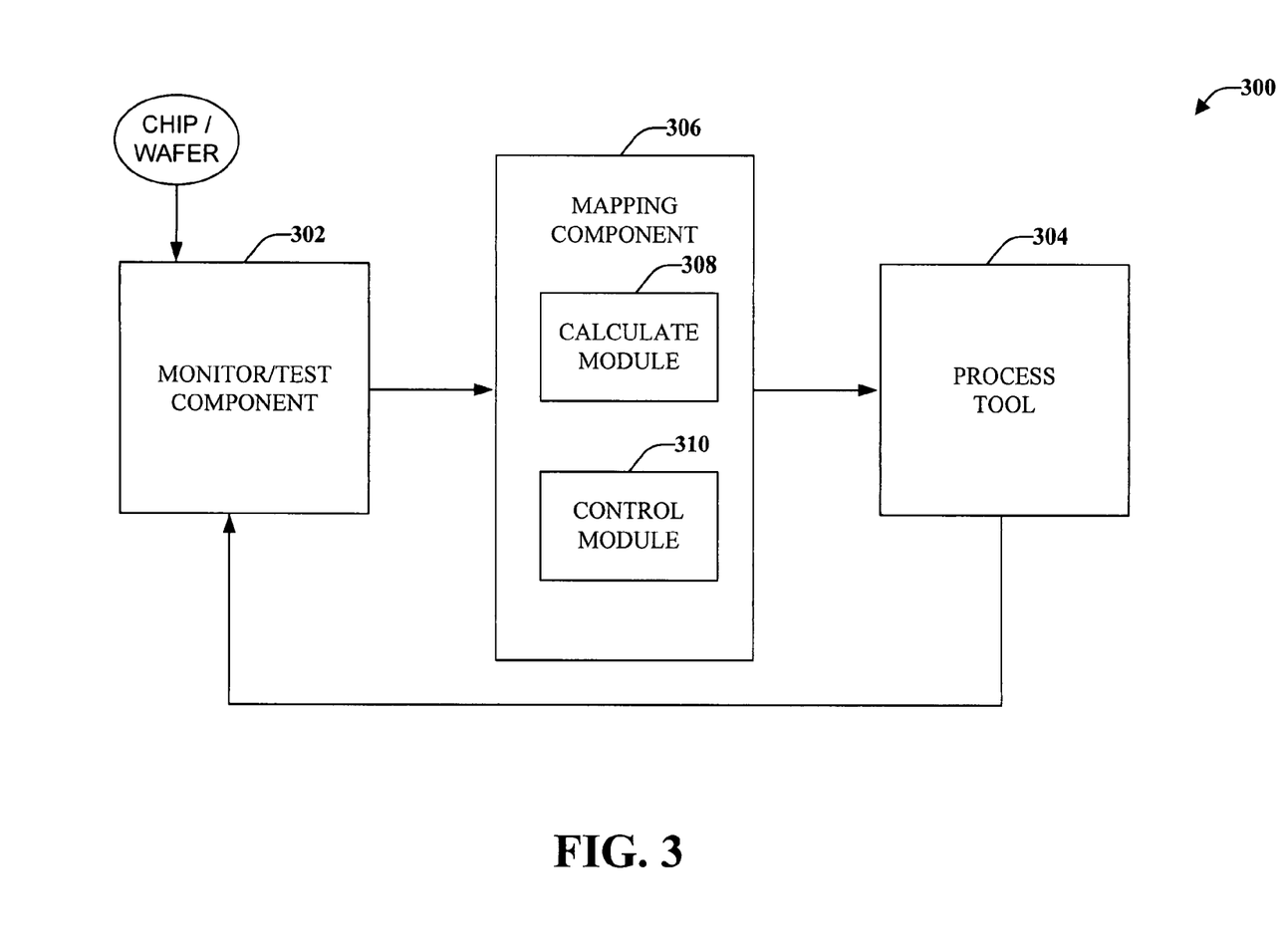
FIG. 3 is a block diagram illustrating a system configured to determine changes to one or more fabrication parameter to directly optimize transistor performance.

FIG. 3 is a block diagram illustrating a system 300 configured to determine changes to one or more fabrication parameter to directly optimize transistor performance. System 300 includes a monitor/test component 302, a mapping component, and a process tool 304. Monitor/test component 302 is configured to analyze various parameters of a fabrication process to optimize transistor performance. The monitor/test component 302 can obtain a variety of measurements and communicate such measurements to the mapping component 306. The mapping component 306 can recommend process modifications and communicate such recommendations to the process tool 304 that can implement the changes. The result of those changes can be feedback through the system 300 and applied to subsequent devices. The subsequent devices are monitored by monitor/test component 302 and a determination is made, by mapping component 306, whether further process modifications are necessary. System 300 can continuously monitor and implement modifications to one or more fabrication parameter to optimize transistor performance.

Mapping component 306 can include a calculate module 308 configured to analyze the measurements received from monitor component 302. Calculate module 308 can apply various algorithms, methods, and/or techniques to the measurements to determine, for example, a scanner exposure dose modified to assist in achieving a desired transistor performance at each location within the chip(s). This calculation can be analyzed by a control module 310 that can compute scanner process parameter changes that are expected to minimize the amount of across-chip and across-wafer performance variation. For example, a change in exposure dose as a function of scan distance (across the chip) or wafer location (across the wafer) can be initiated as one example of a process parameter correction. Mapping component 306 can establish a mapping between scanner exposure dose and transistor performance through the use of one or more test wafers with a programmed range of exposure doses.

The process tool 304 receives the recommended process parameter correction or modification information and can feed this information to a scanner, for example, to improve the performance of chips that will be going through the process after the change is made. The subsequent chips can be monitored, by the monitor component 302 and analyzed, as discussed above, such that future chip performance is optimized. Thus, system 300 operates in a continuous feedback loop to continuously monitor and correct any variances in the system 300 that may affect device performance.

Figure 4:
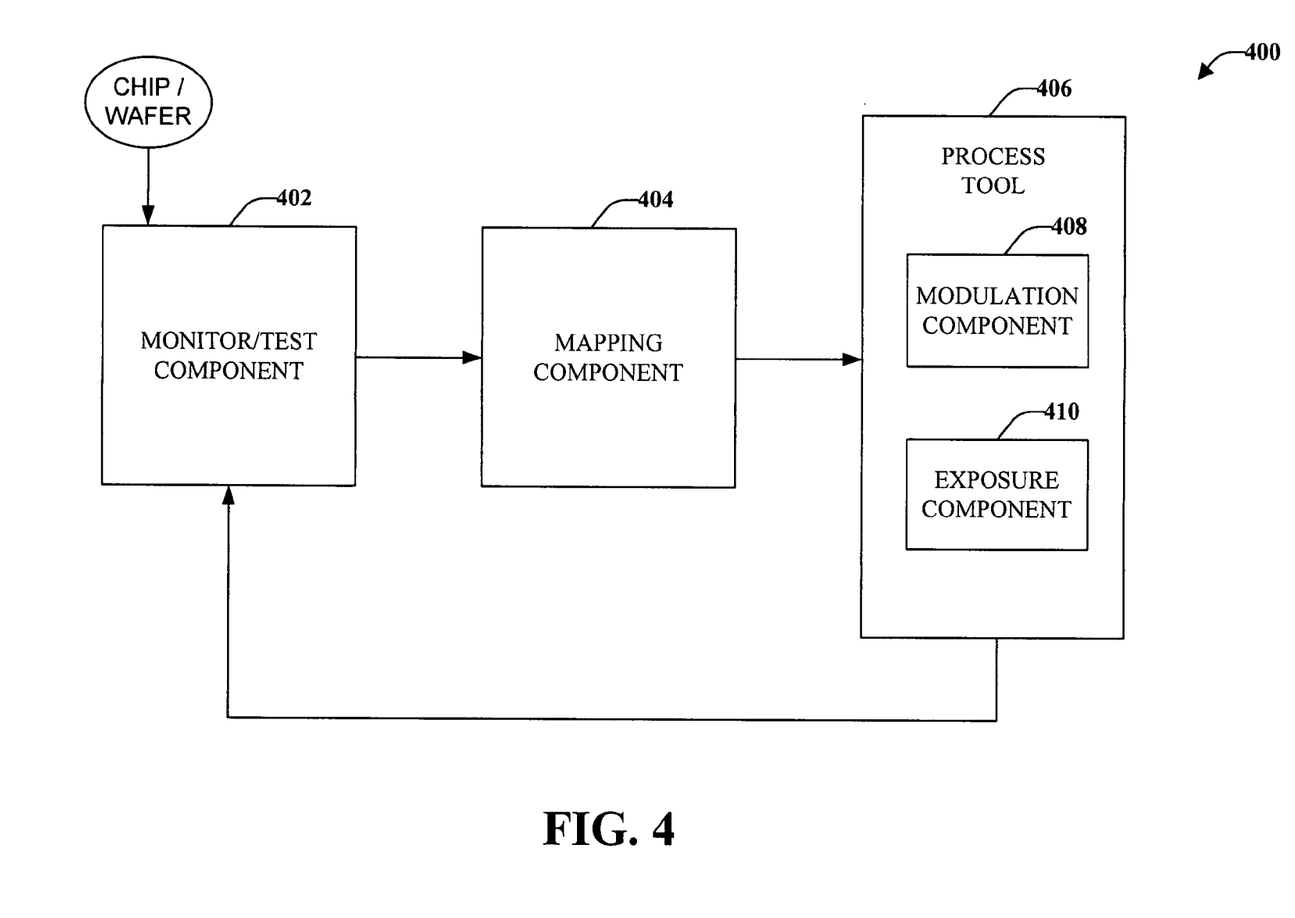
FIG. 4 is a block diagram illustrating a system configured to automatically adjust various operating parameters to improve performance of subsequent chips in a fabrication process.

FIG. 4 is a block diagram illustrating a system 400 configured to automatically adjust various operating parameters to improve performance of subsequent chips in a fabrication process. System 400 includes a monitor/test component 402 configured to measure a plurality of parameters (e.g., scanning speed, altering exposure, ... ). System 400 can include a mapping component 404 configured to receive, obtain, request, etc. the measured parameters and map a desired across-chip exposure dose. The mapped information can be communicated to the process tool 406 for adjustment of the plurality of manufacturing parameters.

Process tool 406 can include various components including a modulation component 408 and/or an exposure component 410. It is to be understood that various other components can be associated with process tool 406 to facilitate implementation of various parameters in a plurality of fabrication processes. Modulation component 408 can be configured to modulate the across-chip exposure dose through, for example, varying the scanning speed or other modulation methods. To compensate across-wafer performance, exposure component 410 can be configured to alter the exposure on a chip-by-chip basis. Thus, each chip is monitored and adjustments to one or more process parameter performed to achieve desired performance from each chip. It is to be understood that system 400 can include more or less components than those shown and/or the components can be arranged in a different order and/or combined. For example, an optional rework component (not shown) can be included in system 400.

In other embodiments, system 400 outputs a recommended change to a user or operator of system. For example, mapping component 404 can recommend a change and notify such recommendation to an operator through a plurality of user interfaces, including for example, a monitor or other type of display device, including both visual (e.g., text, alarm) and/or audio output(s).

Figure 5:
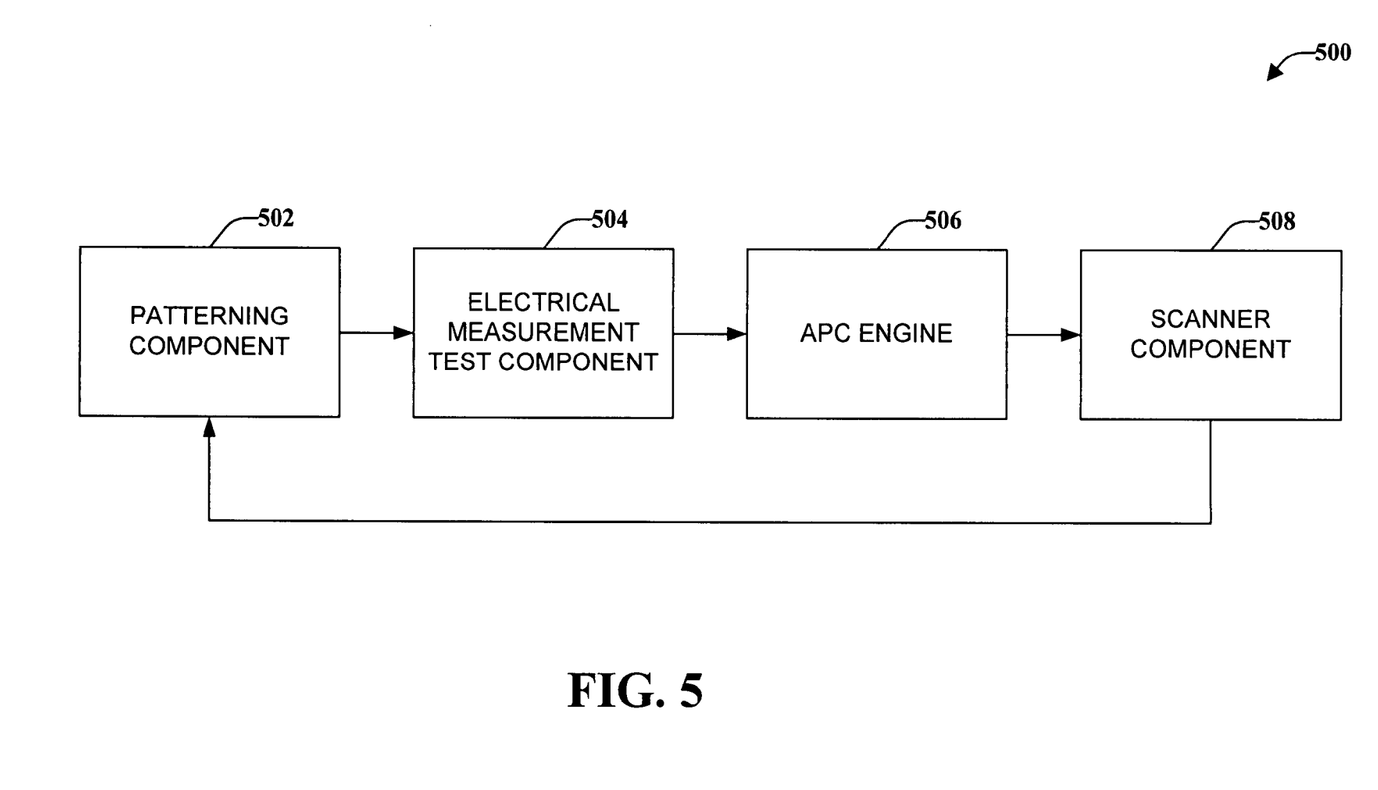
FIG. 5 is a block diagram illustrating an embodiment of a system that provides scanner optimization.

With reference now to FIG. 5, a block diagram of another embodiment of a system 500 that provides scanner optimization is illustrated. System 500 includes a patterning component 502, a high volume electrical measurement component 504, an advanced process control (APC) Engine 506, and a scanner component 508.

The patterning component 502 is configured to apply a patterning process to wafers during a fabrication process. Patterning is a series of steps that result in the removal of selected portions of layers. After removal, the pattern of the layer remains on the wafer surface. Other names for the pattering process include photomasking, masking, photolithograph, and microlithography. The patterning process sets the critical dimensions of the devices. If there are errors during this process, it can result in distorted or misplaced patterns that result in changes in the electrical functioning of the device/circuit.

The high volume electrical measurement component 504 is configured to obtain measurements made at multiple locations with a chip. These measurements can characterize the spatial variation in transistor performance and can be utilized by system 500 to determine parameter changes in one or more fabrication process.

The APC Engine 506 is configured to compute scanner process parameter changes that are expected to minimize the amount of across-chip and/or across-wafer performance variation. This could be, for example, changes in exposure dose as a function of scan distance (across the chip) or wafer location (across the wafer).

The scanner component 508 can receive a mapping between scanner exposure dose and transistor performance. Once the desired across-chip exposure dose map has been obtained, the scanner component 508 can improve its performance on future chips. For example, the across-chip exposure dose may be modulated by varying the scanning speed. In another embodiment, the across-wafer performance may be compensated by altering the exposure on a chip-by-chip basis.

Figure 6:
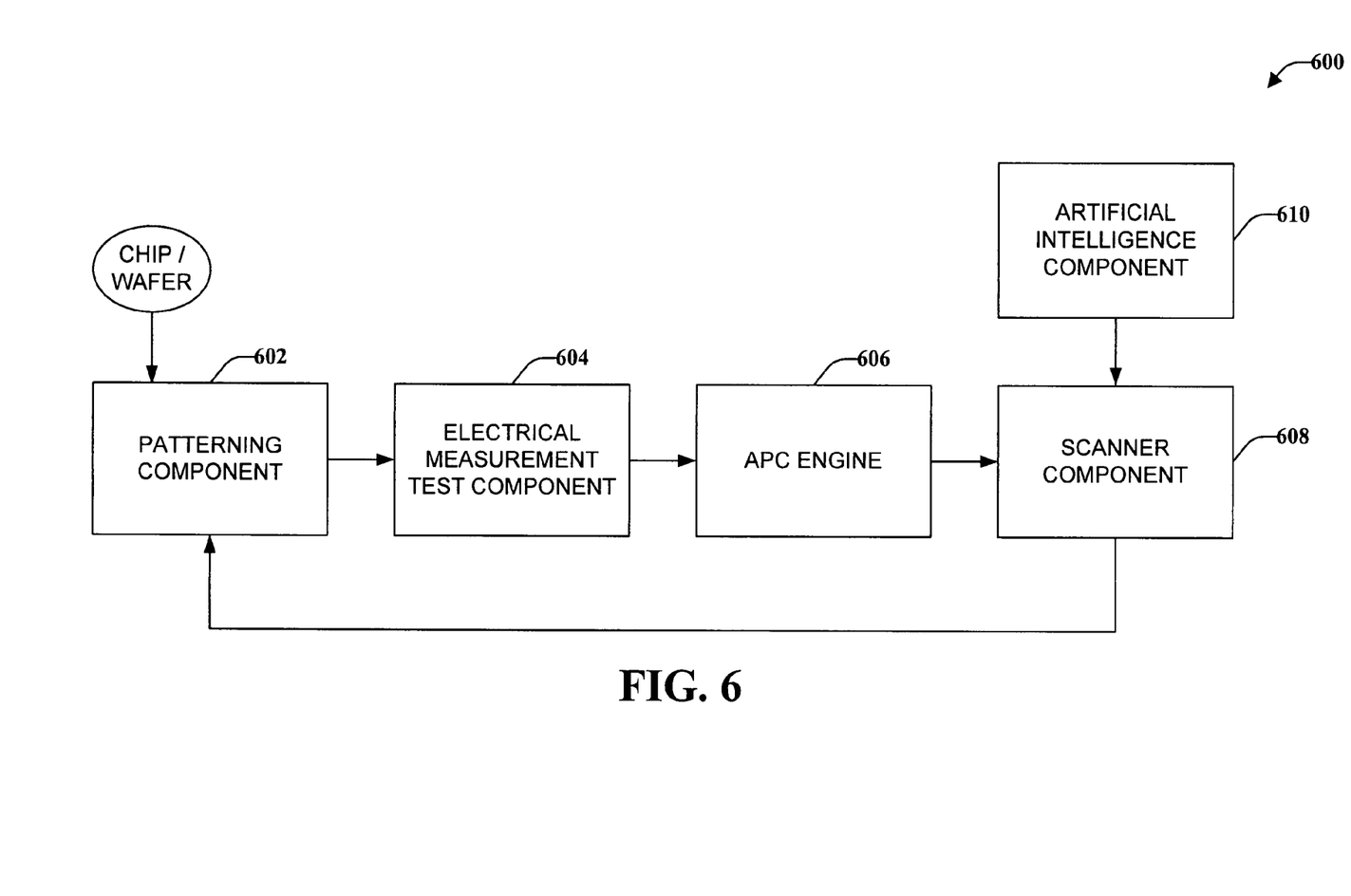
FIG. 6 is a block diagram illustrating a system that employs a machine-learning component to automatically alter one or more parameter associated with chip fabrication.

FIG. 6 is a block diagram illustrating a system 600 that employs a machine-learning component to automatically and/or autonomously alter one or more parameter associated with chip fabrication. System 600 includes a patterning component 602, a high volume electrical measurement component 604, an APC engine 606 and a scanner 608 that operate in manner similar to that shown and described with reference to FIG. 5.

Operatively associated with scanner component 608 is a machine learning or artificial intelligence component 610. The artificial intelligence component 610 can employ various machine learning techniques, algorithms, approaches, etc. to identify and/or detect text in data. For example, the artificial intelligence component 610 can employ a machine-learning algorithm that can reason about or infer device/circuit performance from a set of observations, features, properties, measurements and/or components of the device/components. Inference can be employed to identify a modification and/or can generate a probability distribution over the input data and/or components identified within this input as potential parameter modifications. Such inferences can be probabilistic—that is, the computation of a probability distribution over entities identified within the data. Inference can also refer to techniques employed for rendering higher-level decisions.

Various classification (explicitly and/or implicitly trained) schemes and/or systems (e.g., boosting classifiers, transduction classifiers, inductive classifiers, support vector machines, neural networks, expert systems, Bayesian belief networks, fuzzy logic, data fusion engines . . . ) can be employed in connection with performing automatic detection of system parameters in accordance with the disclosed embodiments. In general, a classifier is a function that maps an input attribute vector, x=(x1, x2, x3, x4, xn), to a confidence that the input belongs to a class, that is, f(x)=confidence (class). Such classification can employ a probabilistic and/or statistical-based analysis (e.g., factoring into the analysis utilities and costs) to automatically differentiate text from other entities within an image. One example of a suitable classifier is a support vector machine (SVM), which, in general, operates by finding a hypersurface in the space of possible inputs, wherein the hypersurface attempts to split triggering criteria from non-triggering criteria. This can make the classification suitable for testing samples, data, etc. that is near, but not identical to training data. Other directed and undirected model classification approaches include, naïve Bayes, Bayesian networks, decision trees, neural networks, fuzzy logic models, and probabilistic classification models providing different patterns of independence, for example. Classification as used herein also is inclusive of statistical regression that is utilized to develop models of priority.

Figure 7:
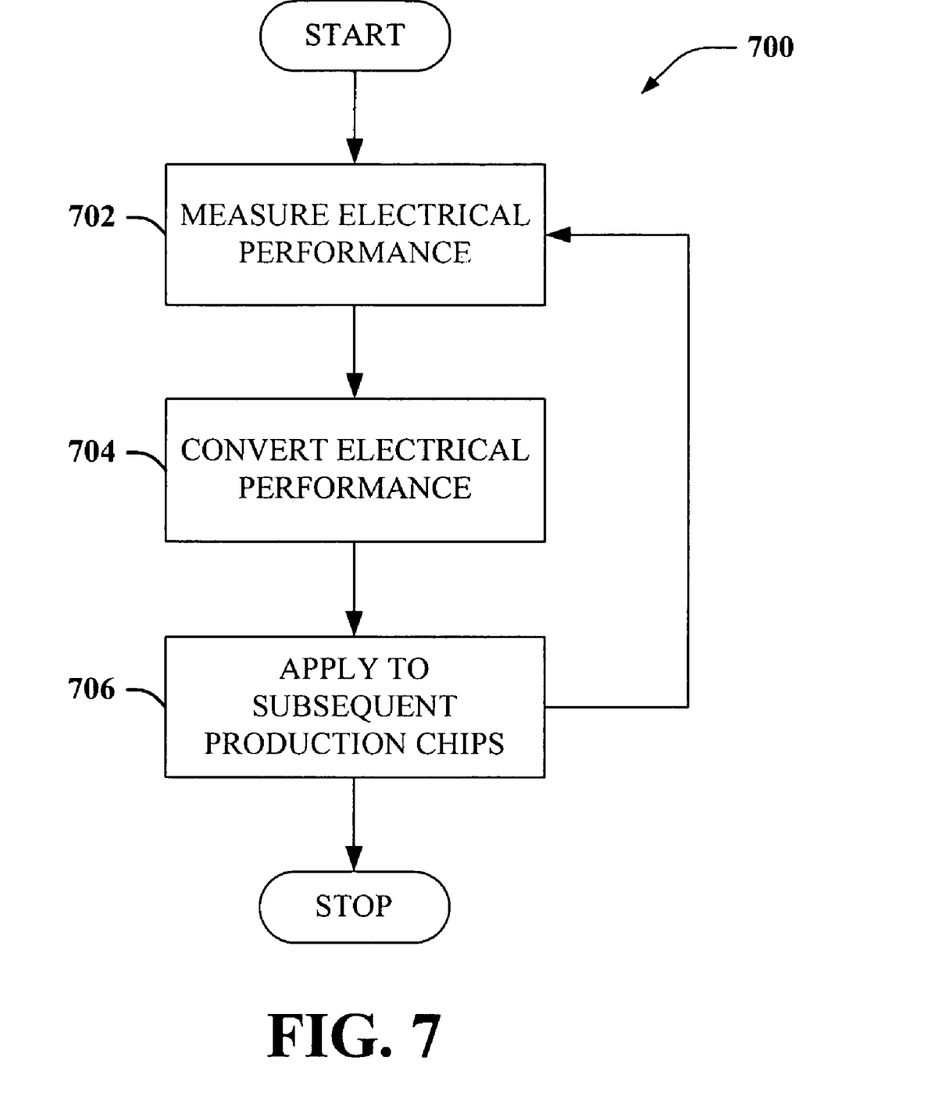
FIG. 7 illustrates a methodology for continuously monitoring and optimizing performance of semiconductor devices.
Figure 8:
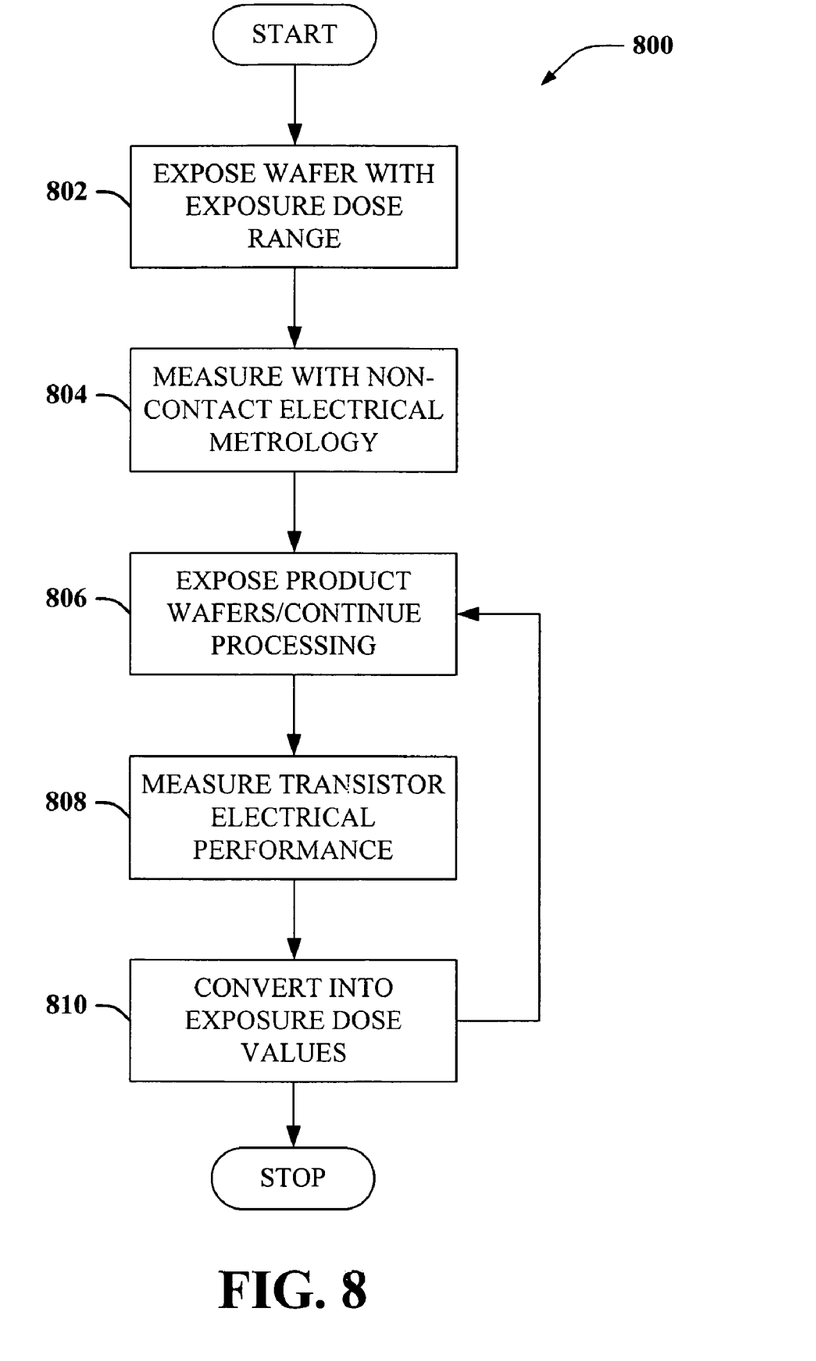
FIG. 8 illustrates a methodology for altering one or more fabrication parameter to reduce across-chip performance variation through non-contact electrical metrology.
Figure 9:
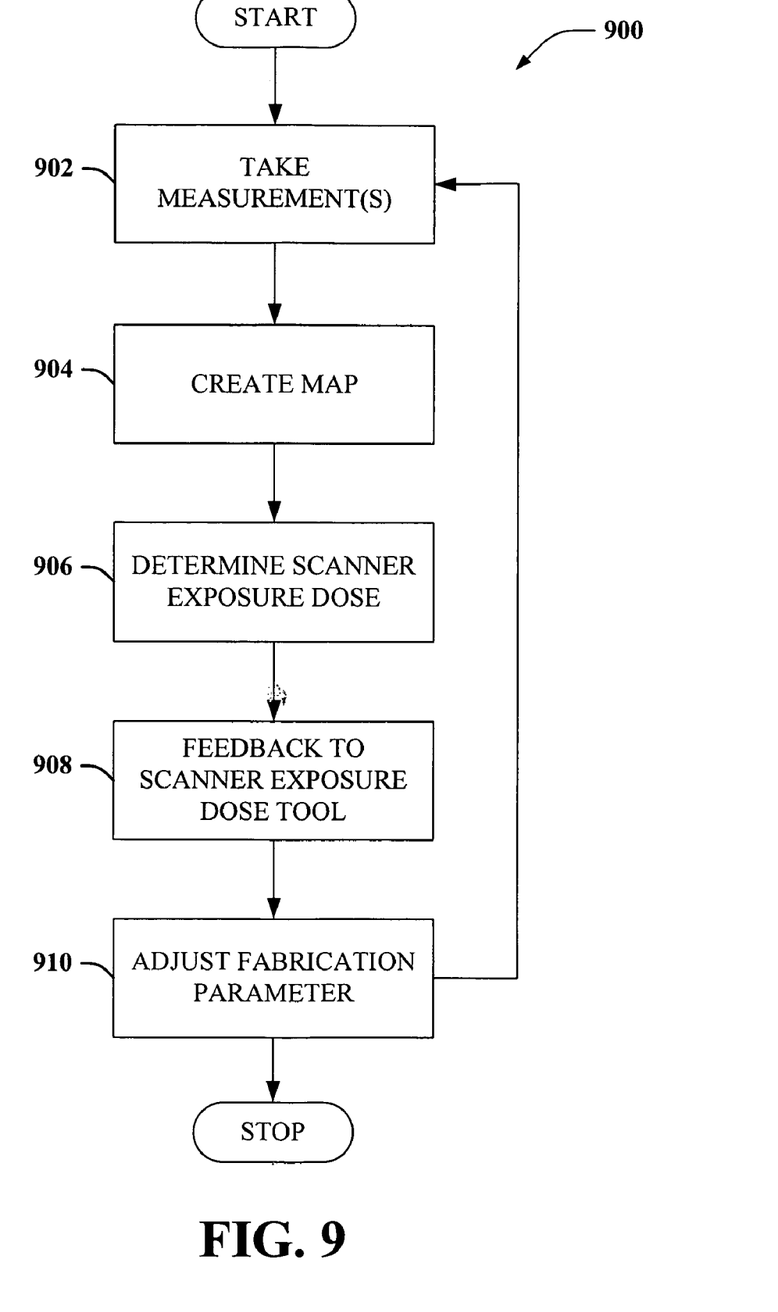
FIG. 9 illustrates a methodology for modifying various parameters of a fabrication process to directly optimize transistor performance.

In view of the exemplary systems shown and described above, methodologies, which may be implemented in accordance with one or more aspects presented herein, will be better appreciated with reference to the diagram of FIGS. 7-9. While, for purposes of simplicity of explanation, the methodologies are shown and described as a series of acts (or function blocks), it is to be understood and appreciated that the methodologies are not limited by the order of acts, as some acts may, in accordance with these methodologies, occur in different orders and/or concurrently with other acts from that shown and described herein. Moreover, not all illustrated acts may be required to implement a methodology in accordance with one or more aspects of the disclosed embodiments. It is to be appreciated that the various acts may be implemented by software, hardware, a combination thereof or any other suitable means (e.g. device, system, process, component) for carrying out the functionality associated with the acts. It is also to be appreciated that the acts are merely to illustrate certain aspects presented herein in a simplified form and that these aspects may be illustrated by a lesser and/or greater number of acts. Moreover, not all illustrated acts may be required to implement the following methodologies. Those skilled in the art will understand and appreciate that a methodology could alternatively be represented as a series of interrelated states or events, such as in a state diagram.

FIG. 7 illustrates a methodology 700 for continuously monitoring and optimizing performance of semiconductor devices. The method 700 begins, at 702 where transistor performance measurements are obtained through the use of non-contact electrical metrology that allows the measurements to be made "in-line" as part of a standard production process flow. The measurement(s) can be taken at multiple locations within a chip to characterize a spatial variation in transistor performance.

At 704 the measured transistor electrical performance is converted the into a corresponding exposure dose value. The exposure dose value is applied to subsequent chips in the fabrication process, at 706. After the subsequent chips are processed, the method continues, at 702, where a measurement of the electrical performance of the subsequent chips is taken. It is to be understood that this act can be recursive such that any number of chips can be analyzed as they enter a particular fabrication process. Moreover, it is to be appreciated that automated and/or dynamic polling of chips can be employed in connection with alternate aspects. For example, the system can be configured to automatically poll and/or report chip information dynamically in accordance with improving chip performance.

With reference now to FIG. 8, illustrated is a methodology 800 for altering one or more fabrication parameter to reduce across-chip performance variation through non-contact electrical metrology. Method 800 starts at 802, where one or more wafer is exposed to an exposure dose range. The wafer(s) can be test wafer(s) which are blank wafers or wafer pieces that are included in the process step for post process measurements. Some tests are destructive and should not be performed on the device wafers or should not be performed on the actual components in the chip, thus test wafers are utilized.

At 804, the wafer(s) are measured utilizing non-contact electrical metrology. Utilizing non-contact electrical metrology allows the testing to be conducted during the production process rather than requiring the chips to be removed from the process for testing purposes. Thus, the fabrication process throughput time is not significantly increased with the disclosed techniques.

The method continues, at 806, where the product wafers are exposed. Exposure is a process whereby an image is encoded in the photoresist layer of a chip. The encoding can be conducted by exposing the chip to light or other radiation source. The product reticle can contain test patterns for non-contact electrical metrology. Processing of the chip continues, including etching, implanting, etc. until functional transistors are complete.

At 808, the transistor electrical performance in product chips is measured utilizing non-contact electrical metrology. The across-chip and across-wafer transistor performance data is converted into exposure dose values, at 810. The conversion can take into account information regarding the exposure dose range that the wafer was exposed to at 802. The converted expose dose value is fed back to a scanner, at 806, for optimization of future chip exposures. As subsequent wafers are tested, the information is continuously fed back to optimize the performance of subsequent wafers.

FIG. 9 illustrates a methodology 900 for modifying various parameters of a fabrication process to directly optimize transistor performance. Method 900 begins, at 902 where one or more measurements are taken. These measurements can be taken as a part of the fabrication process utilizing non-contact electrical metrology. At 904, a map is created of the across-chip transistor performance.

According to an embodiment, a scanner exposure dose is determined, at 906. This scanner exposure dose is a product of the mapping created at 904. The mapping between scanner exposure dose and transistor performance can be established through the use of one or more test wafers with a programmed range of exposure doses. Once the desired across-chip exposure dose map as been obtained, this information is fed back to a scanner exposure tool, at 908, to improve its performance and affect on future chips. Various parameters of the fabrication process are adjusted, at 910. For example, the across-chip exposure dose can be modulated by varying the scanning speed or through alternative methods. Alternatively or in addition, across-wafer performance can be compensated by altering the exposure on a chip-by-chip basis.

Figure 10:
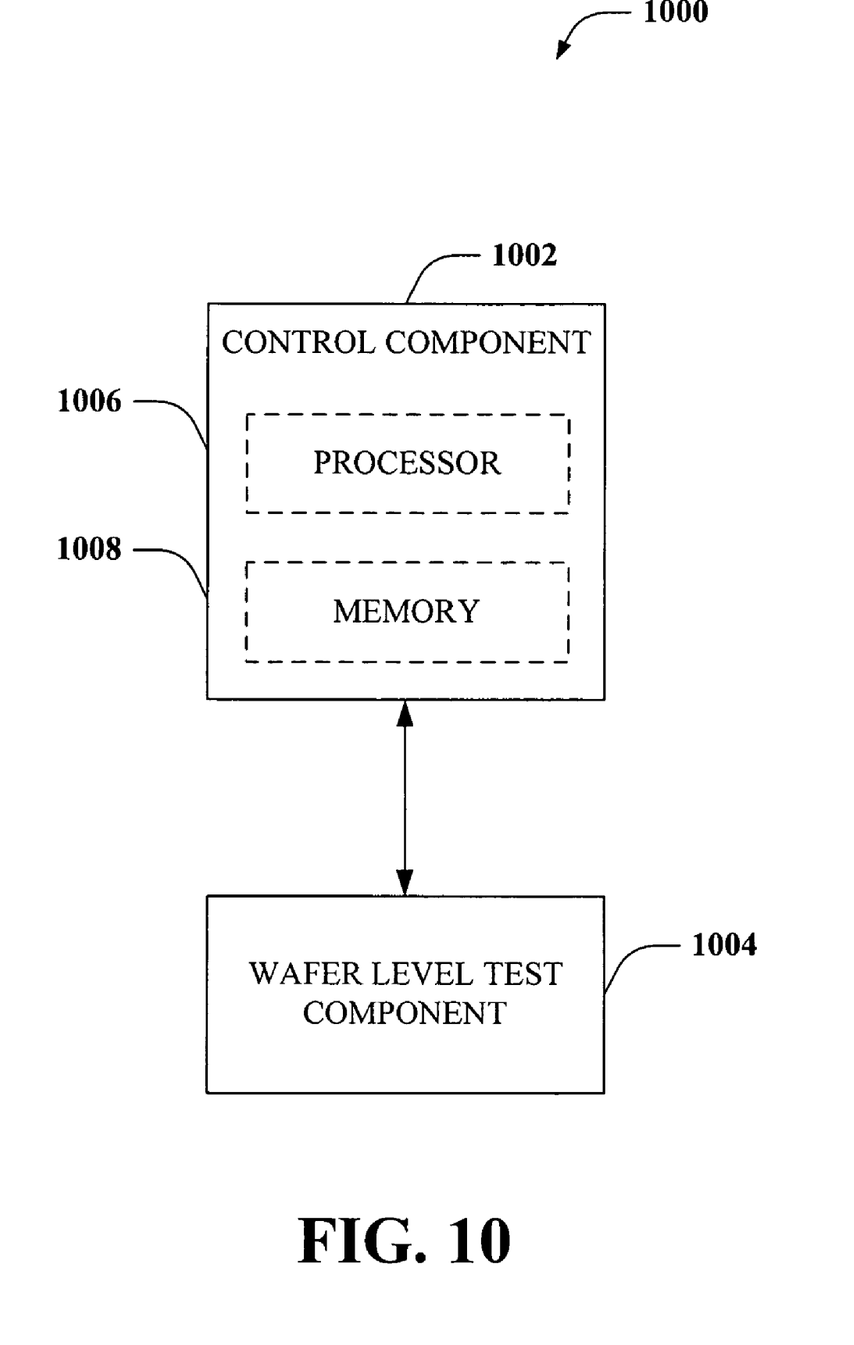
FIG. 10 illustrates a device performance prediction system in accordance with the disclosed embodiments.

FIG. 10 illustrates a device performance prediction system 1000 in accordance with the disclosed embodiments. A control component 1002 is operatively coupled to a wafer level test component 1004. The wafer level test component performs a non-contact electrical metrology on a production wafer to determine performance variation for different feature sizes, orientations, logic structures, etc, and performance. If it is determined that the results of the electrical test will adversely affect device performance and reliability, the information is feedback to the production floor to adjust fabrication parameters as it relates to a lithographic exposure process to optimize the lithographic scanner operation in order to minimize the variation in actual transistor and/or logic block performance across a chip.

Additionally, the control component 1002 comprises a processor 1006 and a memory 1008. It is to be understood that the processor 1006 can be a processor dedicated to predicting device performance, reliability and/or to facilitate scanner operation adjustments, etc., a processor used to control one or more of the components of the device performance prediction system 1000, or alternatively, a processor that is both used to predict device performance, reliability and/or facilitate scanner operation adjustments, etc., and to control one or more of the components of the device performance prediction system 1000.

The memory component 1008 can be employed to retain information associated with, for example, programmed exposure dose ranges, a relationship between exposure dose and transistor performance, etc. Furthermore, the memory 1008 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 1008 of the present systems and methods is intended to comprise, without being limited to, these and any other suitable types of memory.

Figure 11:
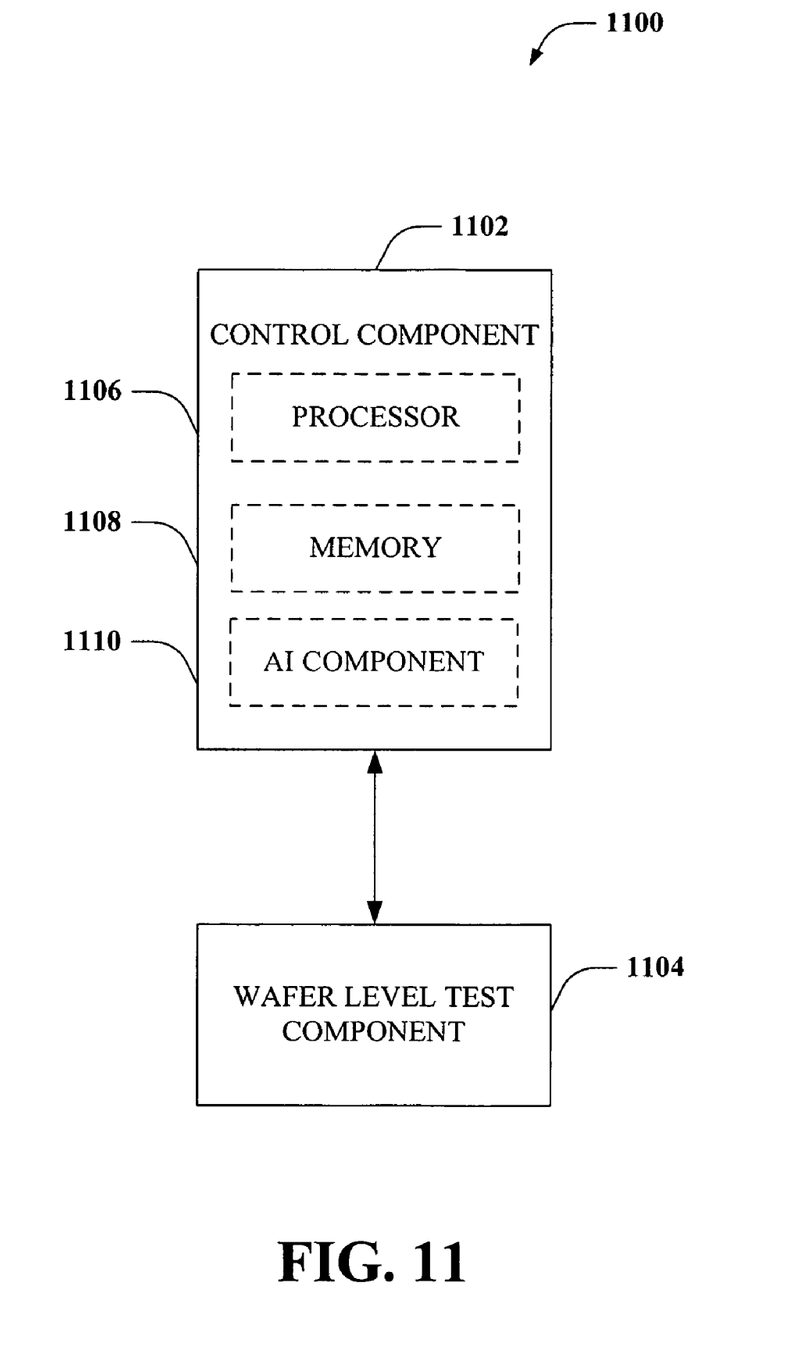
FIG. 11 is an illustration of a system that facilitates predicting reliability and performance of production wafers when various parameters in a wafer fabrication facility are altered.

FIG. 11 is an illustration of a system 1100 that facilitates predicting reliability and performance of production wafers when various parameters in a wafer fabrication facility are altered. System 1100 can employ various inference schemes and/or techniques in connection with predicting device reliability. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject embodiments.

Still referring to FIG. 11, a control component 1102 is operatively connected to a wafer level test component 1104. The wafer level test component 1104 can glean information from a non-contact electrical metrology or other testing means. The control component 1102 comprises a processor 1106, a memory 1108, and an AI component 1110. The AI component 1110 can make inferences regarding, for example, a proper adjustment to exposure dose(s) as a function of scan distance or altering exposure on a per chip basis to facilitate achievement of increased performance of chips made in future production lots.

The control component 1102 can direct the wafer level test component 1104 to perform an electrical metrology test and can further communicate such results to an operator or a database that collects such information. The AI component 1110 can then make further inferences regarding, for example, proper adjustments to exposure doses. The AI component 1110 or the control component 1102 may also predict fabrication parameter adjustments to reduce the variation in performance both across the chip and across the wafer.

Figure 12:
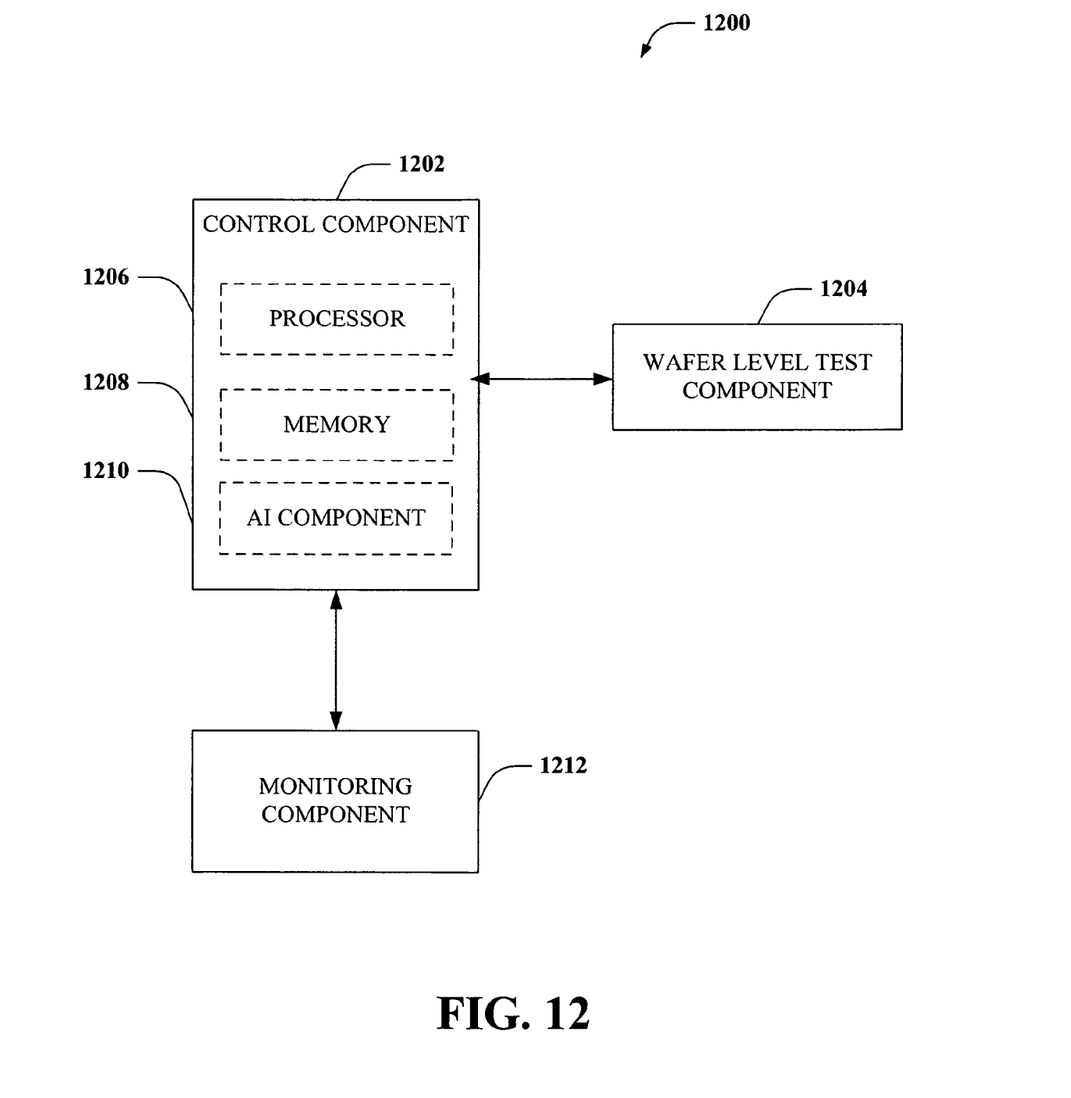
FIG. 12 is an illustration of a wafer level performance prediction system in accordance with the disclosed embodiments

FIG. 12 is an illustration of a wafer level performance prediction system 1200 in accordance with the disclosed embodiments. System 1200 includes a control component 1202 operatively coupled to a wafer level test component 1204. The control component 1202 comprises a processor 1206 that can analyze information received from components with which the control component 1202 is operatively associated. Additionally, the control component 1202 comprises a memory component 1208 that can store information associated with any of the functionalities of the wafer level performance prediction system 1200, and an AI component 1210 that can make inferences to increase efficiency of the wafer level reliability prediction system 1200.

As illustrated in FIG. 12, a monitoring component 1212 is operatively coupled to the control component 1202. The monitoring component can be for example, any suitable wafer level metrology system that can monitor various parameters of test wafers in order to further facilitate the performance of the wafer level test components. Additionally, the monitoring component 1212 can be employed in situ in a wafer fabrication facility to measure extrinsic process variation(s). Such measurements can be received by the control component 1202 and analyzed in conjunction with intrinsic reliability information (e.g. gathered prior to a manufacturing phase, . . . ) to predict reliability of production wafers while mitigating the need for a package-level reliability test, which is time-consuming and does not provide real-time feedback to the fabrication process regarding any parameter adjustments that may be required.

It is further to be appreciated that information gathered by the monitoring component 1212 can be utilized for generating feedback and/or feed-forward data that can facilitate wafer level reliability predictions. The wafer level reliability prediction system 1200 can additionally employ such data to control components and/or operating parameters associated therewith. For instance, feedback/feed-forward information can be generated from sequence analysis to control process variation and/or evaluate the potential impact of a reduced extrinsic component on overall wafer reliability. Additionally, one or a plurality of sensors can be associated with the wafer level reliability prediction system 1200 to permit data to be gathered regarding the state of the wafer (e.g., temperature, density, viscosity, material composition, and/or any other suitable information related to the condition of the wafer).

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A process control system, comprising:
    a component that measures transistor electrical performance in a production wafer;
    a mapping component that converts the transistor performance into exposure dose values;
    a control component comprising an artificial intelligence component that infers adjustments to exposure doses as a function of scan distance to facilitate achievement of increased performance of chips made in future production lots; and
    a process tool that communicates the exposure dose value to a scanner to implement the adjustments to exposure doses.

2. The system of claim 1, the scanner exposes the production wafer to a predetermined exposure dose range.

3. The system of claim 1, the electrical performance is measured at multiple locations of the production wafer to characterize a spatial variation in the transistor performance.

4. The system of claim 1, the measurement is a subset of a standard production process flow.

5. The system of claim 1, the exposure dose value is modulated by a scanning speed.

6. The system of claim 1, the process tool further communicates the exposure dose value to a user.

7. The system of claim 1, the measurement is performed as a subset of a fabrication process.

8. The system of claim 1, further comprising:
    an advanced process control engine that determines at least one scanner process parameter change.

9. The system of claim 1, further comprising:
    an artificial intelligence component that infers a fabrication process modification.

10. A method for reducing across-chip performance variation, comprising:
    measuring transistor electrical performance in production chips;
    converting the transistor electrical performance into a corresponding exposure dose value;
    inferring adjustments to exposure doses as a function of scan distance to facilitate achievement of increased performance of chips made in future production lots; and
    applying the corresponding exposure dose value to subsequent product chips to implement the adjustments to exposure doses.

11. The method of claim 10, before measuring transistor electrical performance in production chips further comprising:

exposing production chips with programmed exposure dose ranges.

12. The method of claim 10, transistor electrical performance is measured with non-contact electrical metrology.

13. The method of claim 10, further comprising:
varying a scanning speed to modulate an across-chip exposure dose.

14. The method of claim 10, further comprising:
altering an across-chip exposure dose on a chip-by-chip basis.

15. The method of claim 10, measuring transistor electrical performance in production chips is made at multiple locations within the chip.

16. The method of claim 10, further comprising:
communicating at least one fabrication parameter change to a user.

17. A system that reduces across-chip performance variation during device fabrication, comprising:
means for exposing a wafer with a programmed exposure dose range;
means for determining a relationship between exposure dose and transistor performance;
means for measuring transistor electrical performance;
means for converting the transistor electrical performance into exposure dose values; and
means for inferring adjustments to exposure doses as a function of scan distance to facilitate achievement of increased performance of chips made in future production lots.

18. The system of claim 17, further comprising:
means for communicating the exposure dose value to the means for exposing a wafer with a programmed exposure dose range.

19. The system of claim 17, the means for measuring transistor electrical performance is performed using non-contact electrical metrology.

20. The system of claim 17, further comprising:
means for automatically adjusting at least one fabrication parameter.

* * * * *